United States Patent [19]
Cole

[11] Patent Number: 5,488,364
[45] Date of Patent: Jan. 30, 1996

[54] RECURSIVE DATA COMPRESSION

[75] Inventor: Michael L. Cole, San Diego, Calif.

[73] Assignee: Sam H. Eulmi, San Diego, Calif.

[21] Appl. No.: 203,998

[22] Filed: Feb. 28, 1994

[51] Int. Cl.⁶ .................................................. H02M 7/30
[52] U.S. Cl. .................................................. 341/50; 341/63
[58] Field of Search .................................. 341/67, 51, 50, 341/87; 358/261.1, 261.4

[56] References Cited

U.S. PATENT DOCUMENTS 4,092,665  5/1978  Saran ....................................... 358/261

OTHER PUBLICATIONS

Benson, *Television Engineering Handbook,* "Discret Cone Transform," pp. 25.36–25.38 (1993).
Ditlea, "The Big Squeeze," *Video,* Aug., 1993; pp. 42–46.
Schuytema, "Data Under Pressure," *Compute,* Oct., 1993; pp. 67–70.
Leeds, "Real Time Compression," *MAC World,* Aug., 1993; pp. 100–105.

*Primary Examiner*—Brian K. Young
*Attorney, Agent, or Firm*—Brown, Martin, Haller & McClain

[57] ABSTRACT

Reconfiguring data in a manner that increases bit redundancy, and compressing the reconfigured data in an iterative or recursive manner until the desired compression ratio is obtained. The data are divided into one or more packets and the bits of the data in each packet are redistributed between two blocks. In one block the number of occurrences of adjacent bits of the "1" state is, on average, greater than the number of occurrences of adjacent bits of the "0" state and adjacent bits of differing states. In the other block the number of occurrences of adjacent bits of the "0" state is, on average, greater than the number of occurrences of adjacent bits of the "1" state and adjacent bits of differing states. The blocks are thus conducive to compression algorithms that exploit bit redundancy.

14 Claims, 5 Drawing Sheets

RECURSIVE DATA COMPRESSION

BACKGROUND OF THE INVENTION

The present invention relates generally to data compression and, more specifically, to a method for increasing data compression ratios by reordering the data bits in a manner that enhances known compression algorithms.

Compression methods condense data to maximize the amount of data that can be stored in a medium having a given storage capacity or to maximize the rate at which data can be transferred in a system having a given bandwidth. Although many compression methods are known in the art, all can be divided into two categories: "lossy," in which some degradation of the original data may occur when the compressed data is decompressed, and "lossless," in which the original data is reproduced exactly when the compressed data is decompressed. Lossy compression methods, such as those promulgated by the Joint Photographic Experts Group (JPEG) and the Motion Picture Experts Group (MPEG), are commonly used in systems that manipulate video and voice data. Lossless compression methods are commonly used in computer systems to maximize the storage capacity of media such as hard disks.

Some lossless compression methods that are specifically for use with storage media such as hard disks increase disk capacity by reordering the data to eliminate wasted space on the disk. However, more general lossless compression methods use run-length encoding (RLE) or a modified form of RLE, such as the Lempel-Ziv-Welch algorithm (LZW) or String Table Compression. In its simplest form, run-length encoding exploits redundancy in the data by locating blocks or runs of a byte having a particular value, and substituting the run with a much smaller number of key bytes that contain both the value of the byte and the number of bytes in the run. To decompress data compressed in this manner, the method examines the key bytes and expands or duplicates the data byte value a number of times equal to the run length. Methods such as RLL and LZW utilize the RLE principle to search for and encode runs consisting of more complex data patterns. The LZW method is described in U.S. Pat. No. 4,558,302, issued to Welch.

Compressing data that have already been compressed may or may not further increase the compression ratio. Performing such iterative or recursive compression using a lossy compression method generally increases the compression ratio, but at the cost of a loss in data quality. Performing recursive compression using a lossless compression method that exploits redundancy in the data, however, generally does not increase the compression ratio. In fact, recursive compression using such a method may actually increase the amount of data.

It would be highly desirable to recursively compress or decompress data using a lossless compression method of a type that exploits redundancy in the data. These problems and deficiencies are clearly felt in the art and are solved by the present invention in the manner described below.

SUMMARY OF THE INVENTION

The present invention comprises a method for improving the compressibility of data by reconfiguring the data in a manner that increases bit redundancy. After performing the reconfiguring method, the reordered data may be compressed using any suitable compression method known in the art. The reconfiguring method may then be repeated on the compressed data. The steps of reconfiguring and compressing may be repeated alternately in an iterative or recursive manner until the desired level of compression is obtained. When it is desired to decompress data compressed in this manner, an inverse reconfiguring method must be performed in which the steps of the reconfiguring method are inverted and performed in reverse order. The inverse reconfiguring method and the decompression method are repeated alternately through the same number of iterations as were performed to compress the data. Although the steps of the reconfiguring method are described herein only with respect to reconfiguring data for subsequent compression, persons skilled in the art will readily be capable of forming the inverse of each step and performing the inverted steps in reverse order in view of these teachings.

The reconfiguring method divides the data into one or more groups or packets and redistributes the bits of each packet among two blocks. In one block the number of occurrences of adjacent bits of the "1" state is, on average, greater than the number occurrences of adjacent bits of the "0" state and adjacent bits of differing states. In the other block the number of occurrences of adjacent bits of the "0" state is, on average, greater than the number of occurrences of adjacent bits of the "1" state and adjacent bits of differing states. The blocks are thus particularly conducive to lossless compression methods that utilize, at least on a fundamental level, the principle of run-length encoding. However, other compression methods, including lossy methods, may also benefit from the reconfiguring.

The reconfiguring method comprises the steps of receiving input data; manipulating the input data in a manner that ensures that a majority of bits in the input data have a predetermined binary state; forming one or more keywords; and forming one or more pairs of blocks. The input data consists of multiple binary words of any suitable length, such as one byte. The predetermined binary state may be "0" or "1", both states being equally suitable.

In an illustrative embodiment, the step of manipulating the input data comprises inverting one or more bits in a manner that can be reversed when it is desired to decompress the compressed data. No bits need be inverted if the input data already have a majority of bits in the predetermined binary state. The bits to be inverted may be selected by counting, over all words of the input data, the number of bits of the predetermined binary state that are located at each bit position. Then, for every word of the input data, the bit located at each bit position for which the corresponding count or sum is less than one-half the total number of words in the input data is inverted. A majority of the bits of the resulting data have a binary state equal to the predetermined state. Each word of this resulting "bit-majoritized" data thus has a probability greater than one-half of having a majority of its bits in the predetermined binary state. A bit-reversal keyword that indicates the positions of the bits that were inverted may be generated and appended to the output data to indicate the bits that must be re-inverted when it is desired to decompress data.

The bit-majoritized data are divided into one or more packets of any suitable length. A keyword is formed in response to each packet, and the data in each packet are distributed between two blocks in accordance with the keyword.

The step of forming a keyword may comprise determining, from among all possible unique binary words or bit patterns of the same length as those of the data words in the packet, the bit pattern that occurs in the packet data with the greatest frequency, where only the bits of the bit pattern having the predetermined state are compared to the packet data, and the remaining bits are masked or considered as "don't cares." If more than one such pattern occurs with the same frequency, the keyword should be the pattern having the greatest number of bits of the predetermined state. If all such patterns have the same number of bits of the predetermined state the patterns are equally suitable as keywords, and a keyword may be selected from among them according to any suitable method, such as by selecting the pattern having the highest numeric value.

The step of forming pairs of blocks comprises sequentially receiving each bit of the packet data and using the keyword as a template to determine whether the bit is placed in the first block or the second block. The bits of the packet data are sequentially examined. The current packet bit is copied to the next bit position in the first block if that packet bit is located in the same position as a keyword bit of the "1" state. The current packet bit is copied to the next position in the second block if that packet bit is located in the same position as a keyword bit of the "0" state. The progression of the positions into which the bits of the packet data are packed is determined according to any suitable rule. For example, the bit positions may first progress through adjacent bits of a word and then progress to the next word when bits have been copied to all positions in a word. Alternatively, the Bit positions may first progress through adjacent words, with successive bits copied to the same bit position in each word, and then progress to an adjacent bit position when bits have been copied to all words in the block. Persons of skill in the art will appreciate that other rules may also be suitable.

Averaged over a statistically significant sample of random input data, the first block will have a percentage of adjacent bits of the "1" state that is high relative to that of the original input data, and the second block will have a percentage of adjacent bits of the "0" state that is high relative to that of the original input data. This increased bit redundancy is conducive to many compression algorithms.

The output of the reconfiguring method is one or more packets, each of which comprises the two blocks and the corresponding keyword. The output may also comprise a bit-reversal reversal keyword. The order in which the blocks and keywords are output is not important, so long as the keyword corresponding to each block can be determined and the order of the packets can be determined.

The foregoing, together with other features and advantages of the present invention, will become more apparent when referring to the following specification, claims, and accompanying drawings.

BRIEF DESCRIPTION OF THE DRAWINGS

For a more complete understanding of the present invention, reference is now made to the following detailed description of the embodiments illustrated in the accompanying drawings, wherein:

FIGS. 2–1 to 2–4 show a flow diagram of a method for reconfiguring data to increase its compressibility.

DESCRIPTION OF A PREFERRED EMBODIMENT

Figure 1:
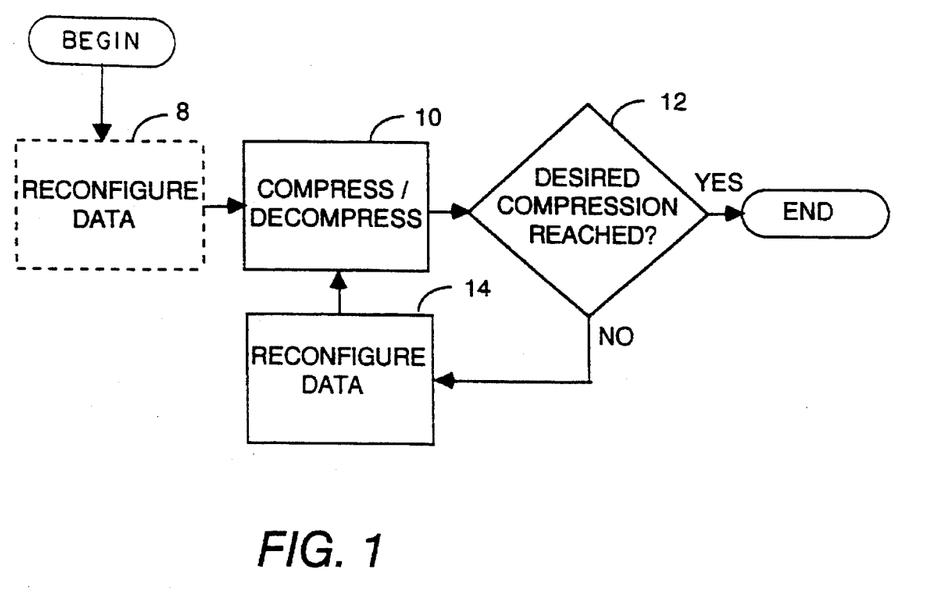
FIG. 1 is a flow diagram of a method for recursively compressing or decompressing data.
Figure 21:
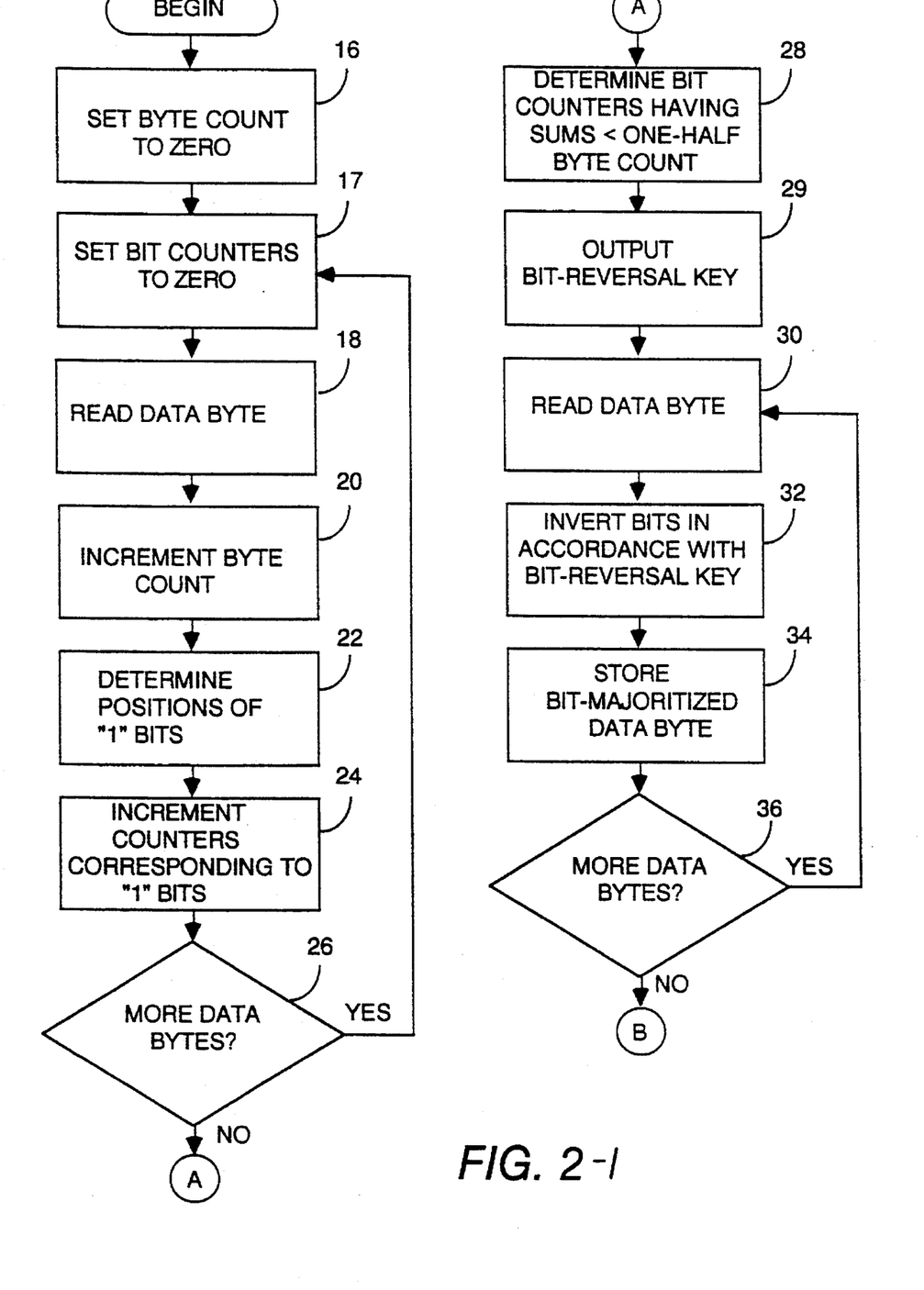
Figure 22:
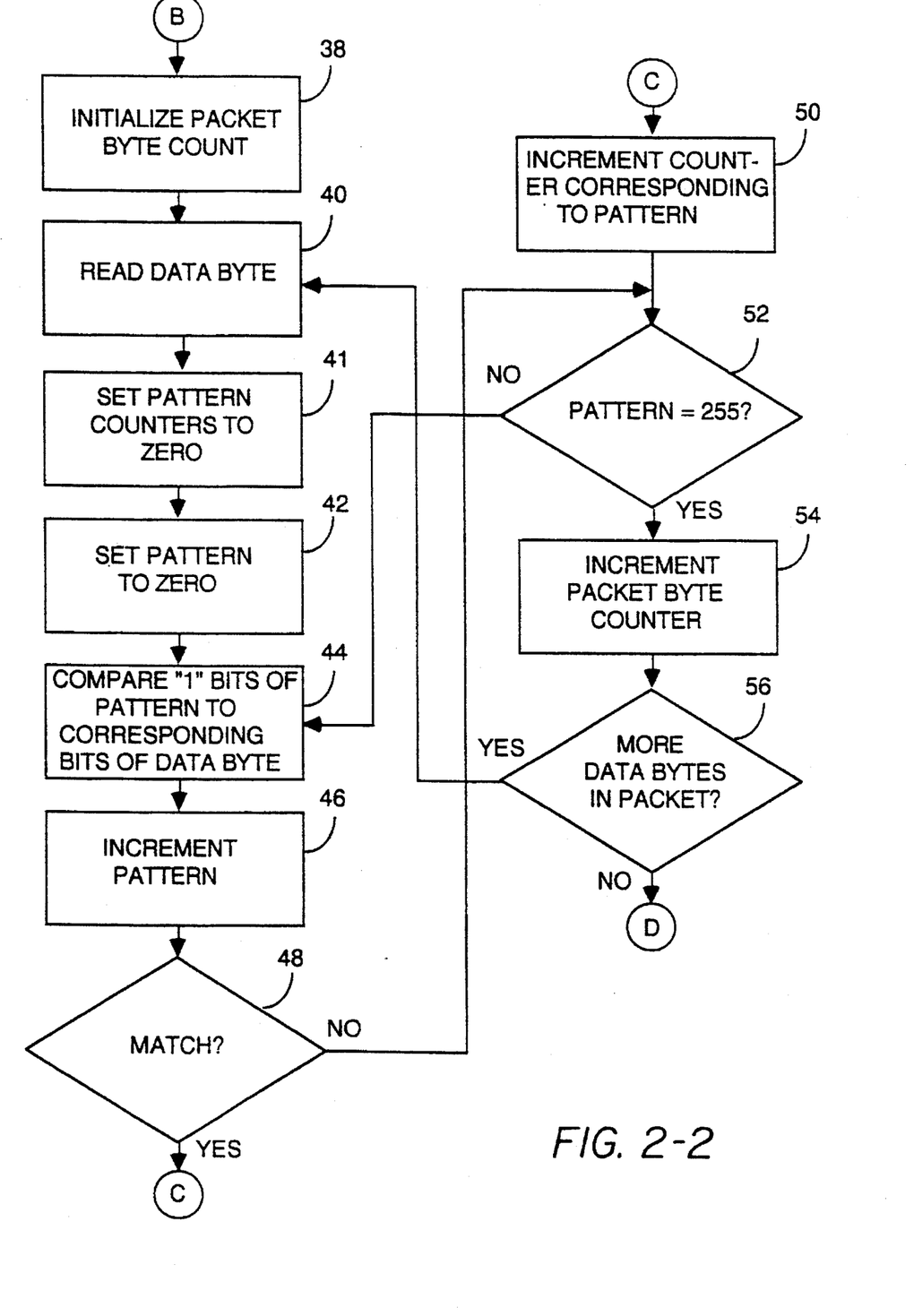
Figure 23:
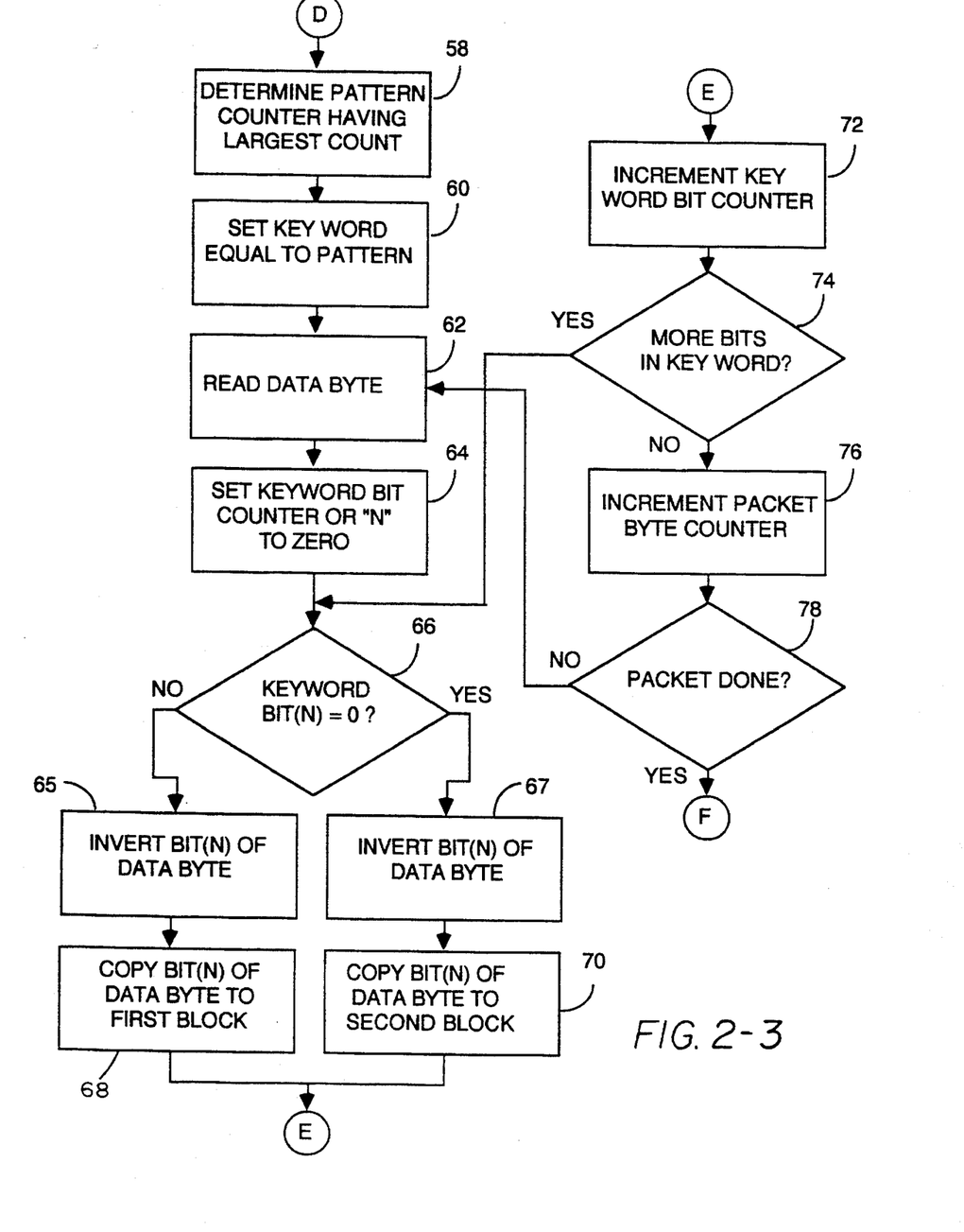
Figure 24:
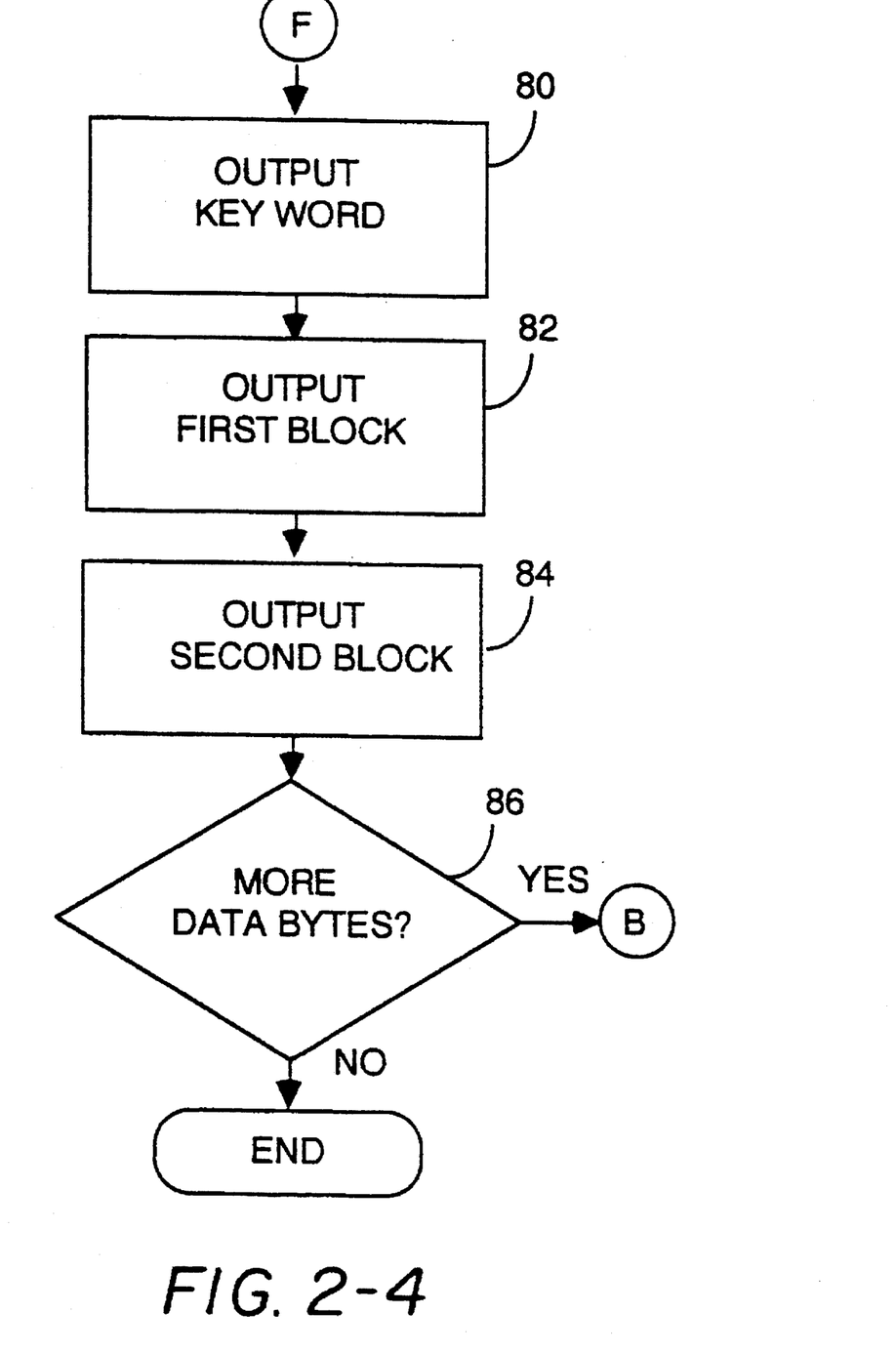

As illustrated in FIG. 1, data are compressed at step 10 and, if at step 12 the desired level of compression has not been attained, a reconfiguration method is performed at step 14. The reconfiguration method increases bit redundancy, as described in detail below. The reconfigured data are thus more conducive to compression algorithms that exploit such bit redundancy. Although the compression method performed at step 10 may be any compression method that exploits redundancy in the data, LZW is preferred. Such compression methods are well-known and are not described herein. Steps 10 and 14 may be repeated until the desired compression level is attained. In addition, the reconfiguration method may be performed at step 8 before any compression has been performed.

The data reconfiguration method is illustrated in FIGS. 2–1 to 2–4. At step 16 the byte count, which represents the number of bytes read from an input source, is set to zero. At step 17 the bit counters, the purpose of which is explained below, are also set to zero. At step 18 the first byte of the data to be reconfigured is read. The data may be read from a software structure such as a file or directly from a hardware data storage medium such as a random-access memory or a disk. At step 20 the byte count is incremented.

At step 22 the input data byte is examined, and the positions of bits having a binary state of "1" in the input byte are determined. Eight counts or sums are maintained, each corresponding to one of the eight bit positions in an input byte. At step 24 a bit counter is incremented if the bit of the input byte in the position corresponding to that bit counter has a binary state of "1". For example, if an input byte is "1110110", the bit counter corresponding to the least significant bit, $bit_0$, is not incremented because that bit has a state of "0". The bit counter corresponding to the next most significant bit, $bit_1$, is incremented because that bit has a state of "1". Similarly, the bit counters corresponding to $bit_2$, $bit_4$, $bit_5$ and $bit_6$ are incremented, but the bit counter corresponding to $bit_3$ is not.

At step 26 the method returns to step 17 if more data bytes are to be read from the input source. All bytes of the input data are thus processed as described above with respect to steps 17–24. If all input bytes have been read the method proceeds to step 28. At step 28 the count or sum in each bit counter is compared to a number equal to one-half the byte count, and the bit counters having sums less than one-half the byte count are identified. At step 29 a bit-reversal key, which indicates the bit positions corresponding to the identified counters, is formed and output.

At step 30 the first input byte is again read. At step 32 all bits of the input byte in positions corresponding to the counters identified at step 28 are inverted. At step 34 the resulting byte is stored. At step 36 the method returns to step 30 if another input byte is to be read. If all input bytes have been read the method proceeds to step 38. The stored bytes have a majority of their collective bits in the "1" state and are thus referred to as "bit-majoritized." It should be noted any suitable method may be used to bitmajoritize the data, and that the method of reading all input bytes first to determine a bit-reversal key and then again to invert their bits is only one example of such a method.

The stored bit-majoritized bytes are distributed into first and second data blocks in the remaining steps of the reconfiguration method. The data to be reconfigured are processed in packets. At step 38 the packet byte counter is initialized to zero. A packet of input data consists of a predetermined number of bytes that is less than or equal to the total number of such bytes. For example, if the input data consists of 256 bytes, a suitable packet size could be 64 bytes. The packet size need not, however, be a multiple of the total number of input bytes. The packet size selection generally involves a tradeoff between the execution speed of the software implementing the present invention and the compression ratio that is ultimately attainable. The optimal packet size may also depend on implementation-specific factors, i.e., design choices that are well within the capabilities of persons of skill in the art but that are not critical to the present invention. The optimal packet size may be determined empirically by experimentation.

At step 40 the first (now bit-majoritized) data byte of the packet is read. The bytes will be compared to pattern bytes consisting of all unique combinations of eight bits. A number of counts, each corresponding one pattern is maintained. There are 256 pattern counters for maintaining such counts in the present example. At step 41 each pattern counter is set to zero. At step 42 the pattern byte is set to a value of zero. At step 44 the "1" bits of the pattern byte are compared to the bits in corresponding positions in the data byte. Only the "1" bits are compared, and the "0" bits of the pattern byte are disregarded, i.e., they are treated as "don't cares," in determining whether a match exists At step 46 the pattern byte is incremented. In this manner, all possible unique combinations of eight bits are generated. If a match is found to exist at step 48, the pattern counter corresponding to the matched pattern is incremented at step 50. If the pattern byte does not match the data byte the method proceeds to step 52. At step 52 the method returns to step 44 if not all patterns have been compared. If all patterns have been compared the method proceeds to step 54.

Patterns of eight bits range in value from zero to 255. A pattern in this range could, for example, have a numeric value of 20 in decimal notation or "00010100" in binary notation. A data byte of "00010111", for example, would match this pattern because all the "1" bits of the pattern are included within the data byte. A data byte of "11011100" would also match, but a data byte of "11101111" would not.

If, at step 56, more data bytes are to be read the method returns to step 40. If all data bytes have been read and thus compared to all patterns, the method proceeds to step 58. At step 58 the pattern corresponding to the counter having the largest count is determined. At step 60 the keyword for the current packet is set equal to this pattern. If two or more counters have an equal count, which is larger than all other counts, the corresponding pattern having the largest number of bits of the predetermined state is selected as the keyword. For example, if the pattern "00011011" and the pattern "10000000" have the same count, the former pattern is selected because it has four "1" bits and the latter pattern has only one "1" bit. If two or more counters have an equal count, which is larger than all other counts, and the patterns corresponding to those counts have an equal number of bits, the pattern having the largest numerical value is selected as the keyword.

It should be noted that the patterns may be generated and compared in any suitable manner, and the method of counting through all possible numeric values is only one example of a suitable method. It should also be noted that the predetermined binary state of "1", which is common to steps 22, 24 and 44 in this exemplary embodiment, is an arbitrary selection; a state of "0" would be equally suitable.

The data bytes are distributed between two blocks in accordance with the keyword. At step 62 the first data byte is again read. At step 64 a keyword bit counter is set to zero. At step 66 the keyword bit indexed by the keyword bit counter is examined. The method proceeds to step 65 if the keyword bit is a "1" and proceeds to step 67 if the keyword bit is a "0". The data bit in the same position as that of the indexed keyword bit is copied to the first block at step 68 or copied to the second block at step 70. Each data bit is preferably inverted at step 65 or 67 before it is copied at step 68 or 70, respectively, because it has been found that doing so typically further increases data compressibility. However, as discussed above, the packet size selection and other factors may also affect data compressibility.

The data bits are copied to successive positions in each block. When a data bit has been copied to the last bit position of a byte location, the next data bit is copied to the first bit position of the next byte location.

At step 72 the keyword bit counter is incremented and, at step 74, it is determined whether all bits of the keyword have been examined. If the last keyword bit has not been reached the method returns to step 66. If all keyword bits have been examined, the method proceeds to step 76. At step 76 the packet byte counter is incremented. At step 78 it is determined whether all data in the packet have been read and distributed between the two blocks. If more data are to be distributed the method returns to step 62 to read the next data byte. If all data in the packet have been read and distributed, the method proceeds to step 80.

The following example illustrates the distribution of bits of the input data using the keyword "10011011" and the data byte "01011101". The least significant bit of the data byte, $bit_0$, is a "1" which is copied to the first block because $bit_0$ of the keyword is "1". $Bit_1$ of the data byte is a "0", which is copied to the first block because $bit_1$ of the keyword is "1". $Bit_2$ of the data byte is a "1", which is copied to the second block because $bit_2$ of the keyword is "0". $Bit_3$ and $bit_4$ of the data byte, which are both "1", are copied to the first block because $bit_3$ and $bit_4$ of the keyword are both "1". $Bit_5$ and $bit_6$ of the data byte, which are "0" and "1" respectively, are copied to the second block because $bit_5$ and $bit_6$ of the keyword are both "0". $Bit_7$ of the data byte is a "0", which is copied to the first block because $bit_7$ of the keyword is "1". The resulting bytes of the first and second blocks are:

| First Block | Second Block |
|---|---|
| "XXX01101" | "XXXXX101" |

The bits of the next data byte are copied to the next bit positions in the blocks. (These positions are represented by the symbol "X" because their values are as yet unknown.) If the next data byte is, for example, "10100110" the resulting bytes of the first and second data blocks are:

| First Block | Second Block |
|---|---|
| "01001101" | "XX011101" |
| "XXXXXX10" | |

The two blocks will typically have different lengths. In the preceding example, the first block will fill faster than the second block because the keyword has more "1" bits than "0" bits.

The packet is output at steps 80–84: At step 80 the packet keyword is output; at step 82 the first block is output; and at step 84 the second block is output. These output data may be written to any suitable hardware or software structure that can be used as a source of input for the compression method. At step 86 it is determined whether all data bytes have been read. If more data bytes are to be read, the method returns to step 38 to begin the next packet. The reconfiguration method ends if all data have been read and distributed.

The output of the reconfiguring method thus preferably comprises the bit-reversal key byte followed by a sequence of packets, each consisting of a keyword followed by one block, which is followed by the other block. This output may then be compressed as described above with respect to FIG. 1. Alternatively, all first blocks may be output together in sequence, followed by all second blocks output together in sequence. The keywords may be output together or interleaved with the blocks of one or both of the block sequences. For example, a sequence of all keywords may be followed by a sequence of all first blocks, which may be followed by a sequence of all second blocks. The block sequences may be written to the same file or output device or to separate files or output devices. If the latter alternative is used the two block sequences may then be compressed separately.

Data that have been compressed following the above-described reconfiguration method may be decompressed following an inverse reconfiguration method. In the inverse reconfiguration method, each packet keyword is used to extract bits from the two blocks in the reverse order in which they were placed in the blocks. The inverse of the bit-majoritization step is then performed on the resulting data to reproduce the original input data. The bit-reversal key, which was included in the output of the reconfiguration method, is used to invert any bits that were previously inverted. As described above, the bit-reversal key is a byte that has a "1" bit in each bit position corresponding to bits of the input data bytes that were inverted. The bit-reversal key may thus be exclusive-ORed with each of the bit-majoritized bytes to reproduce the corresponding original input data byte.

The above-described recursive compression method may be performed using any suitable combination of hardware and software. However, it is preferably performed using software operating on a personal computer. Such software may be readily constructed by persons of ordinary skill in the art in view of these teachings. The compression method may be performed using a readily available software package, such as "PKzip," which is produced by PKWare of Glendale, Wis. To recursively compress data using such a software package, the input data file is compressed using the compression software, and the compressed output is written to another file. That file is then reconfigured using the reconfiguration method described above, and the reconfigured output is written to another file. That file, in turn, is compressed using the compression software. These steps are repeated until the desired compression ratio is attained or until no further increases are observed in the compression ratio.

It should be noted that the recursive compression method need not utilize the same compression algorithm on each iteration. For example, iterations using "PKzip" may be interleaved with those using another software package such as "LHarc" or "PKzip." Furthermore, although a commercially available software package may be used as described above, the speed and convenience with which data are recursively compressed may be maximized by integrating software for performing the reconfiguration method with software for performing the compression method.

Obviously, other embodiments and modifications of the present invention will occur readily to those of ordinary skill in the art in view of these teachings. Therefore, this invention is to be limited only by the following claims, which include all such other embodiments and modifications when viewed in conjunction with the above specification and accompanying drawings.

I claim:

1. A method for compressing data, comprising the steps of:

receiving a plurality of input data words, each consisting of a plurality of bits located in a plurality of positions;

compressing said plurality of input data words to form a plurality of compressed data words using a run-length based compression method;

forming a plurality of reconfigured data words in response to said plurality of compressed data words, said plurality of reconfigured data words having an average frequency of occurrence of adjacent bits of the same binary state that is greater than the average frequency of occurrence of adjacent bits of the same binary state in said plurality of compressed data words; and compressing said plurality of reconfigured data words using said run-length based compression method.

2. The method for compressing data recited in claim 1, wherein each said input data word consists of eight bits.

3. The method for compressing data recited in claim 1, wherein said compression method is LZW.

4. The method for compressing data recited in claim 1, wherein said step of forming a plurality of reconfigured data words compresses the step of:

producing a plurality of bit-majoritized data words in response to said plurality of input data words, said plurality of bit-majoritized data words having a total number of bits of a predetermined binary state greater than one-half the total number of bits in said plurality of input data words;

distributing said bit-majoritized data words into first and second data blocks, said first data block having an average frequency of occurrence of adjacent bits of the same first binary state that is greater than the average frequency of occurrence of adjacent bits of the same first binary state in said plurality of input data words, said second data block having an average frequency of occurrence of adjacent bits of the same second binary state that is greater than the average frequency of occurrence of adjacent bits of the same second binary state in said plurality of input data words.

5. The method for compressing data recited in claim 4, wherein said step of distributing said bit-majoritized data words comprises the step of forming a key word, said key word relating the positions of bits in said input data words to the positions of bits in said first and second data blocks.

6. The method for compressing data recited in claim 4, wherein said step of distributing said bit-majoritized data words comprises the steps of:

receiving a packet comprising a predetermined number of bit-majoritized data words from among said plurality of bit-majoritized data words;

comparing each said bit-majoritized data word of said packet to a plurality of bit patterns consisting of all unique combinations of binary states of a plurality of bits equal in number to the number of bits in said bit-majoritized data words and having at least one bit of said predetermined binary state;

forming a plurality of pattern sums among all said bit-majoritized data words of said packet, each said pattern sum corresponding to one said bit pattern, each said pattern sum equaling the number of times one said bit-majoritized data word includes one or more bits having said predetermined binary state in the same positions as all said bits having said predetermined binary state in said bit pattern;

determining a key word, said key word consisting of said bit pattern corresponding to said greatest pattern sum;

sequentially comparing each said bit-majoritized data word of said packet to said key word;

copying said bits of said compared data word located in the same position in said compared data word as each bit of said key word having said predetermined binary state to bit locations in a first data block; and copying said bits of said compared data word located in the same position in said compared data word as each bit of said key word having a binary state other than said predetermined binary state to bit locations in a second data block.

7. The method for compressing data recited in claim 4, wherein said step of producing a plurality of bit-majoritized data words comprises the steps of:

determining whether the binary state of a bit is a predetermined binary state for each said input data word of said plurality of input data words at each said position;

forming a plurality of bit sums among all said input data words, each bit sum of said plurality of bit sums corresponding to one said position, each said bit sum equaling the number of times a bit having said predetermined binary state occurs in each said position;

reversibly inverting the binary state of each bit in each said input data word located in a position corresponding to a bit sum having a value less than one-half the number of input data words in said plurality of input data words.

8. The method for compressing data recited in claim 7, wherein said step of producing a plurality of bit-majoritized data words further comprises the step of producing a mask word for indicating the positions of inverted bits.

9. A method for reconfiguring data to increase bit redundancy, comprising:

receiving a plurality of input data words, each said input data word consisting of a plurality of bits located in a plurality of positions, each said bit having a binary state;

producing a plurality of bit-majoritized data words in response to said input data words, said plurality of bit-majoritized data words having a total number of bits of a predetermined binary state greater than one-half the total number of bits in said plurality of input data words;

receiving a packet comprising a predetermined number of bit-majoritized data words from among said plurality of bit-majoritized data words;

determining a key word from among a plurality of bit patterns consisting of all unique combinations of binary states of a plurality of bits equal in number to the number of bits in said input data words and having at least one bit of said predetermined binary state, said key word having the greatest number of bits of said predetermined binary state in the same positions as bits of said bit-majoritized data words having said predetermined binary state;

forming a first data block having only bits of said bit-majoritized data words located in the same positions in said bit-majoritized data words as said bits of said key word having said predetermined binary state;

forming a second data block having only bits of said bit-majoritized data words located in the same positions in said bit-majoritized data words as said bits of said key word having a binary state other than said predetermined binary state; and producing a plurality of output data words comprising said key word, said first data block, and said second data block.

10. The method for reconfiguring data recited in claim 9, wherein each said data word consists of eight bits.

11. The method for reconfiguring data recited in claim 9, wherein said predetermined binary state is a "1".

12. A method for reconfiguring data to increase bit redundancy, comprising:

receiving a plurality of input data words, each said data word consisting of a plurality of bits located in a plurality of positions, each said bit having a binary state;

determining whether the binary state of a bit is a predetermined binary state for each said data word of said plurality of data words at each said position;

forming a plurality of bit sums among all said data words, each bit sum of said plurality of bit sums corresponding to one said position, each said bit sum equaling the number of times a bit having said predetermined binary state occurs in each said position;

reversibly inverting the binary state of each bit in each said data word located in a position corresponding to a bit sum having a value less than one-half the number of data words in said plurality of data words;

receiving a packet comprising a predetermined number of data words from among said plurality of data words;

comparing each said data word of said packet to a plurality of bit patterns consisting of all unique combinations of binary states of a plurality of bits equal in number to the number of bits in said data words and having at least one bit of said predetermined binary state;

forming a plurality of pattern sums among all said data words of said packet, each said pattern sum corresponding to one said bit pattern, each said pattern sum equaling the number of times one said data word includes one or more bits having said predetermined binary state in the same positions as all said bits having said predetermined binary state in said bit pattern;

determining a key word, said key word consisting of said bit pattern corresponding to said greatest pattern sum among said plurality of pattern sums;

sequentially comparing each said data word of said packet to said key word;

copying said bits of said compared data word located in the same position in said compared data word as each bit of said key word having said predetermined binary state to sequential bit locations in a first data block;

copying said bits of said compared data word located in the same position in said compared data word as each bit of said key word having a binary state other than said predetermined binary state to sequential bit locations in a second data block; and producing a plurality of output data words comprising said key word, said first data block, and said second data block.

13. The method for reconfiguring data recited in claim 12, further comprising the step of producing a mask word for indicating the positions of inverted bits, and said plurality of output data words further comprises said mask word.

14. The method for reconfiguring data recited in claim 12, wherein each said data word consists of eight bits.

* * * * *